United States Patent
Chang et al.

(10) Patent No.: US 7,388,752 B2
(45) Date of Patent: Jun. 17, 2008

(54) SERIES-CONNECTED HEAT DISSIPATER COUPLED BY HEAT PIPE

(75) Inventors: Chien-Lung Chang, Taipei (TW); Hui He, Taipei (TW); Chih-Peng Wu, Taipei (TW)

(73) Assignee: Asustek Computer Inc., Taipei (TW)

( * ) Notice: Subject to any disclaimer, the term of this patent is extended or adjusted under 35 U.S.C. 154(b) by 120 days.

(21) Appl. No.: 11/500,872

(22) Filed: Aug. 9, 2006

(65) Prior Publication Data
US 2007/0139894 A1 Jun. 21, 2007

(30) Foreign Application Priority Data
Dec. 20, 2005 (TW) .............. 94145294 A

(51) Int. Cl.
*H05K 7/20* (2006.01)
(52) U.S. Cl. ............... 361/715; 361/701; 361/702; 361/719; 361/720; 165/80.2; 165/80.3; 165/80.4; 165/80.5; 165/104.21; 165/104.26; 165/104.33; 174/15.1; 174/15.2; 174/16.3; 174/252
(58) Field of Classification Search ........ 361/686, 361/687, 689, 690, 700–707, 709–715, 717–721, 361/724–728, 729, 802, 803, 827; 257/706–727; 165/80.2, 80.3, 104.33, 185, 104.21, 104.26; 174/15.1, 16.3, 252
See application file for complete search history.

(56) References Cited

U.S. PATENT DOCUMENTS

| | | | | |
|---|---|---|---|---|
| 4,935,864 A * | 6/1990 | Schmidt et al. ............. | 363/141 |
| 5,050,039 A * | 9/1991 | Edfors ........................ | 361/710 |
| 5,305,179 A * | 4/1994 | Sono et al. ................. | 361/718 |
| 5,784,263 A * | 7/1998 | Nelson ........................ | 361/785 |
| 5,786,985 A * | 7/1998 | Taniguchi et al. .......... | 361/707 |
| 6,055,157 A * | 4/2000 | Bartilson .................... | 361/699 |
| 6,181,556 B1 * | 1/2001 | Allman ....................... | 361/690 |
| 6,185,101 B1 * | 2/2001 | Itabashi et al. ............. | 361/704 |
| 6,411,511 B1 * | 6/2002 | Chen .......................... | 361/697 |
| 6,418,021 B1 * | 7/2002 | Itabashi et al. ............. | 361/704 |
| 6,496,375 B2 * | 12/2002 | Patel et al. ................. | 361/719 |
| 6,532,141 B1 | 3/2003 | Wu | |
| 6,621,713 B2 * | 9/2003 | Amaike et al. ............. | 361/797 |
| 6,937,474 B2 * | 8/2005 | Lee ............................. | 361/715 |
| 7,019,974 B2 * | 3/2006 | Lee et al. .................... | 361/700 |
| 7,209,356 B2 * | 4/2007 | Lee et al. .................... | 361/719 |
| 7,254,025 B2 * | 8/2007 | Baldwin, Jr. ............... | 361/700 |
| 7,272,002 B2 * | 9/2007 | Drapeau ..................... | 361/687 |
| 2007/0047200 A1 * | 3/2007 | Huang ........................ | 361/695 |

\* cited by examiner

*Primary Examiner*—Michael Datskovskiy
(74) *Attorney, Agent, or Firm*—Muncy, Geisslor, Olds & Lowe, PLLC

(57) ABSTRACT

A series-connected heat dissipater coupled by heat-pipe used for the interface cards of a computer system. Wherein, a plurality of additional auxiliary dissipaters are provided onto the insertion slots adjacent to the interface cards, and are connected to the main dissipater through heat pipe, hereby effectively solving the heat dissipation problem of the interface cards, so that the main-machine-board will not be bent and deformed due to the overweight caused by the interface cards.

9 Claims, 4 Drawing Sheets

SERIES-CONNECTED HEAT DISSIPATER COUPLED BY HEAT PIPE

BACKGROUND

1. Field of Invention

The invention relates a heat dissipater used for the interface card of the computer system, and in particular to a series-connected-heat-pipe type heat dissipater used for the display card.

2. Related Art

With the rapid progress and development of the computer technology, the operation speed of CPU is ever increasing, thus generating even much more heat. Presently, in addition to CPU, the South Bridge & North Bridge chips on the main-machine-board, and even the graphic chips on the display card, their operation speeds are likewise getting faster, as such requiring the installation of more dissipaters to reduce and keep their temperature within the normal operation range.

In general, the chip sets of the above-mentioned computer system can be classified as the chips disposed on the main-machine-board, such as CPU, South Bridge and North Bridge chips, and the chips disposed on the interface card such as the graphic chip on the display card. However, with the operation speed of the electronic components on the chips getting increasingly faster more than the heat dissipater's capability can catch up to dissipate the heat generated. In comparison, the heat dissipation capability of the heat dissipater is facing increasing challenge. For the CPU, Northbridge, Southbridge chips on the main-machine-board, it is much easier to design and install heat dissipater having more powerful heat dissipating capability, due to existence of large gap between the main-machine-board and the shell. However, for the interface card such as the display card, the gap between the interface cards are rather limited, as such heat is liable to accumulate in the hot air and not easy to dissipate, thus significantly affecting and reducing its heat dissipation effect. In addition, the size of the shell is gradually miniaturized, and recently with the emergence of microsystems, thus the heat dissipation function and capability of the dissipater for the chips on the main-machine-board are facing increasing challenge.

Moreover, since most of the interface cards are inserted into the insertion slots of the main-machine-board, thus in addition to the problem of the narrow spacings between the inserted interface cards, the arrangement of the inserted cards must also be taken into consideration, even if the two adjacent insertion slots can be reserved for the installation of bigger heat dissipater. Yet with the increasing size of the heat dissipater, its weight is increased correspondingly, so that the bottom insertion slot and the side fixing to shell are not strong enough to support the long and thin design of the interface card, thus resulting in the bending and deformation of the main-machine-board supporting the interface card. And in more serious case, this may affect the normal operation of the computer system.

In this respect, refer to U.S. Pat. No. 6,532,141, wherein, threaded bolts are used to connect and fix a plurality sets of heat-dissipation fins. Though this may be applied to the ordinary chips (such as, Southbridge and Northbridge chips) on the main-machine-board, however, if it is applied on an interface card such as a display card, that would lead to the bending of the display card due to overweight.

SUMMARY OF THE INVENTION

The objective of the invention is to provide a series-connected-heat-pipe type heat dissipater that can be used to solve the problem of the insufficient dissipation of the heat generated by the interface card. The bending of the main-machine-board due to the overweight of the interface card can also be avoided.

In the embodiment of the series-connected-heat-pipe type heat dissipater, the main dissipater is disposed on the chip of the interface card, and the auxiliary dissipater disposed or secured on the adjacent insertion slots for fixing. The heat pipes are provided to connect the main dissipater and the auxiliary dissipater, hereby the heat of the chip of the interface card received and the collected by the main dissipater is effectively dissipated, thus raising the heat dissipation efficiency. Meanwhile, the auxiliary dissipater is secured to the insertion slot of the adjacent interface card, thus the weight of the interface card will not be additionally increased, as such the main-machine-board will not be bent or deformed due to the overweight caused by the interface card.

The device and technology of the invention will be described in detail as follows in conjunction with the attached drawings.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow for illustration only, and thus are not limitative of the invention, and wherein.

DETAILED DESCRIPTION OF THE INVENTION

The purpose, construction, features, and functions of the invention can be appreciated and understood more thoroughly through the following detailed description with reference to the attached drawings.

Figure 1:
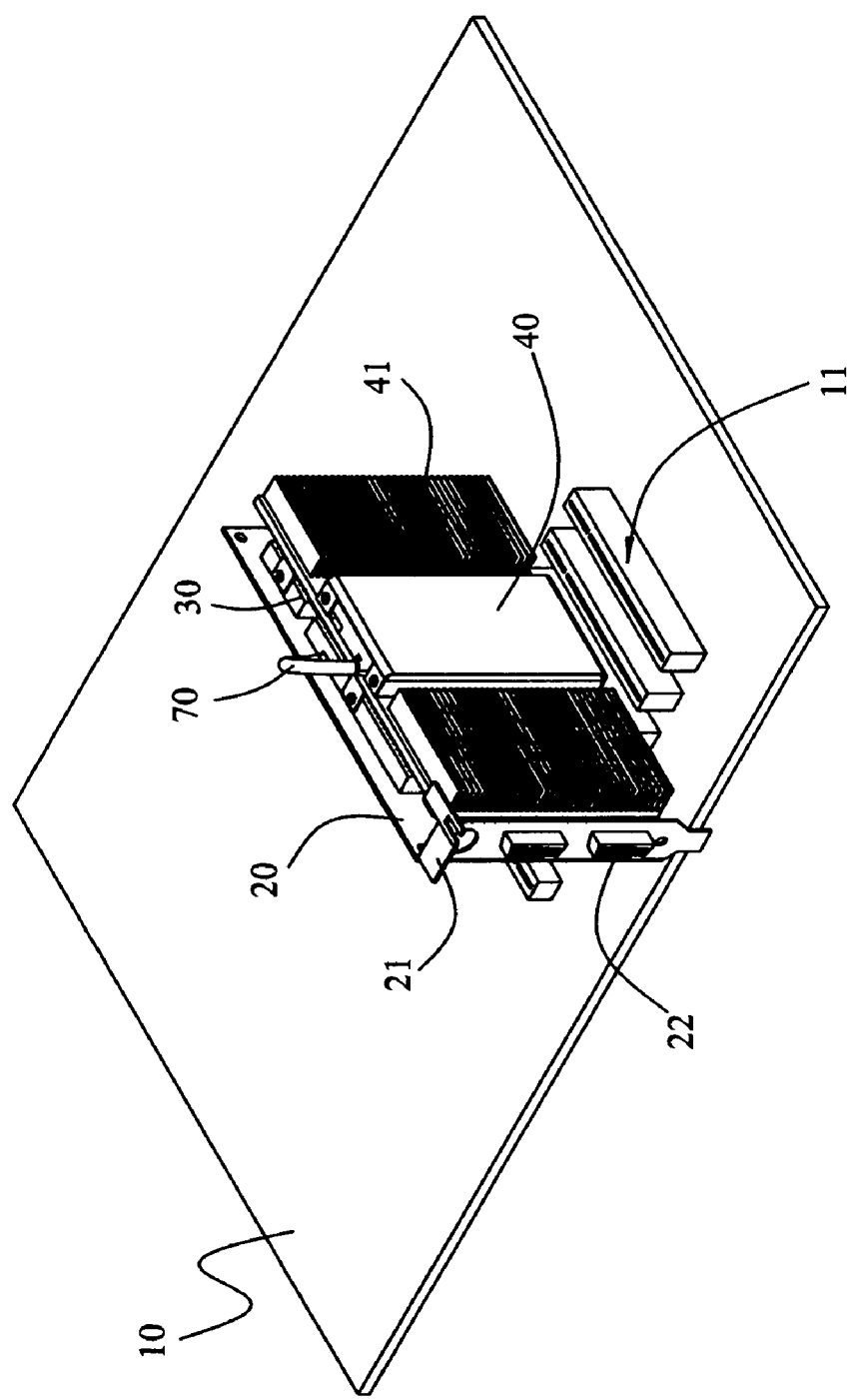
FIG. 1 is a schematic diagram for a series-connected-heat-pipe type heat dissipater according to an embodiment of the invention.

Firstly, refer to FIG. 1 for a schematic diagram for a series-connected-heat-pipe type heat dissipater according to an embodiment of the invention. As shown in FIG. 1, the heat dissipater utilized on a computer system includes a main-machine-body 10 and a housing (not shown). Wherein, a plurality of insertion slots are provided on the mainmachine-board 10 for insertion of the interface cards. In the computer system of early days, in addition to the display card which is indispensable, various interface cards are added to provide additional functions such as the audio card, web card, and the SCSI control card depending on the actual requirements. However, for the product of the present stage, most of the functions required are provided by the cards disposed directly on the main-machine-board 10, such as the audio card, web card, and in many cases even the display card is likewise disposed on the main-machine-board 10, such that most of the insertion slots are vacant. Usually, the additionally added interface cards are the cards used for providing high level functions, such as the high level graphic card, high level audio card, thus the heat they generate is raised accordingly. Therefore, in most of the computer system, the insertion slots 11 adjacent to the interface card 20 are vacant. As such, in the invention, an auxiliary dissipater 40 is utilized to increase heat dissipation efficiency based on this consideration. Meanwhile, the vacant adjacent insertion slot 11 is arranged, so that the addition of the auxiliary dissipater 40 in combination of the interface card 20 will not cause the problem of overweight.

Figure 2:
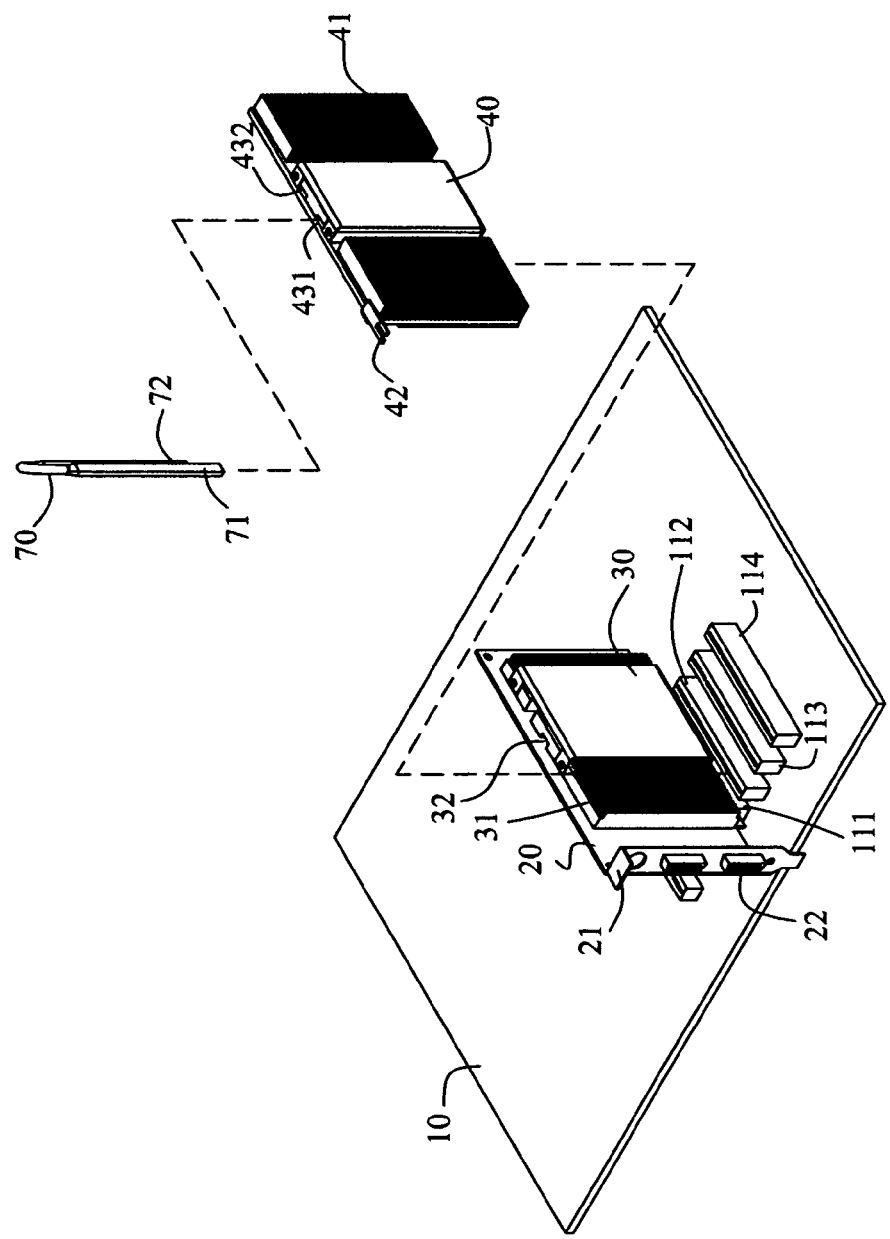
FIG. 2 is an exploded view of a series-connected-heat-pipe type heat dissipater according to an embodiment of the invention.

Next, refer to FIG. 2 for an exploded view of a series-connected-heat-pipe type heat dissipater according to an embodiment of the invention. As shown in FIG. 2, in the heat dissipater of the invention, a plurality of insertion slots 11 are provided on the main-machine-board 10, which are composed of a first insertion slot 111, a second insertion slot 112, a third insertion slot 113, and a fourth insertion slot 114. An interface card 20 is inserted onto the first insertion slot 11, with its one end used as a bracket 21 protruding out the main-machine-board 10, and the top portion of the bracket 21 can be secured to the edge of the shell (not shown). One side of the interface card 20 is provided with the connectors 22 and protruding. The main dissipater 30 is provided on the interface card 20, and is placed on the chips of the interface card 20, and a plurality of heat dissipation fins 31 are disposed thereon to dissipate the heat generated by the chips. The auxiliary dissipater 40 is designed as a plate shape similar to that of an interface card 20 and is inserted onto a second insertion slot 112, namely the insertion slot adjacent to the insertion slot (the first insertion slot 111) used for the interface card 20, and a plurality of heat dissipation fins 41 are provided thereon and are connected through the heat pipes 70, so that heat can be transferred from the main dissipater 30 to the auxiliary dissipater 40, thus raising the efficiency of heat dissipation.

The heat pipe 70 is of roughly U shape, and its two ends bending downward to form a first connection portion 71 and a second connection portion 72. Thus, through plugging the first connection portion 71 into the first installation hole 431 of the auxiliary dissipater 40, and plugging the second connection portion 72 into the installation hole 32 of the main dissipater 30, the main dissipater 30 is connected to the auxiliary dissipater 40, thus the heat pipe 70 can be used to transfer heat. Naturally, the shape of the heat pipe 70 is not restricted to U shape, as long as it can be used to connect the main dissipater 30 to the auxiliary dissipater 40, and its installation is not restricted to the top of the interface card 20, it may also disposed on one side of the bracket 12. Moreover, elastic plates, bolts or rotation buttons may be provided inside the first installation hole 431 of the auxiliary dissipater 40 and the installation hole 32 of the main dissipater 30, so as to fix and secure the first connection portion 71 and the second connection portion 72 of the heat pipe 70. Naturally, other fixing and securing means may be utilized to achieve the same purpose.

Figure 3:
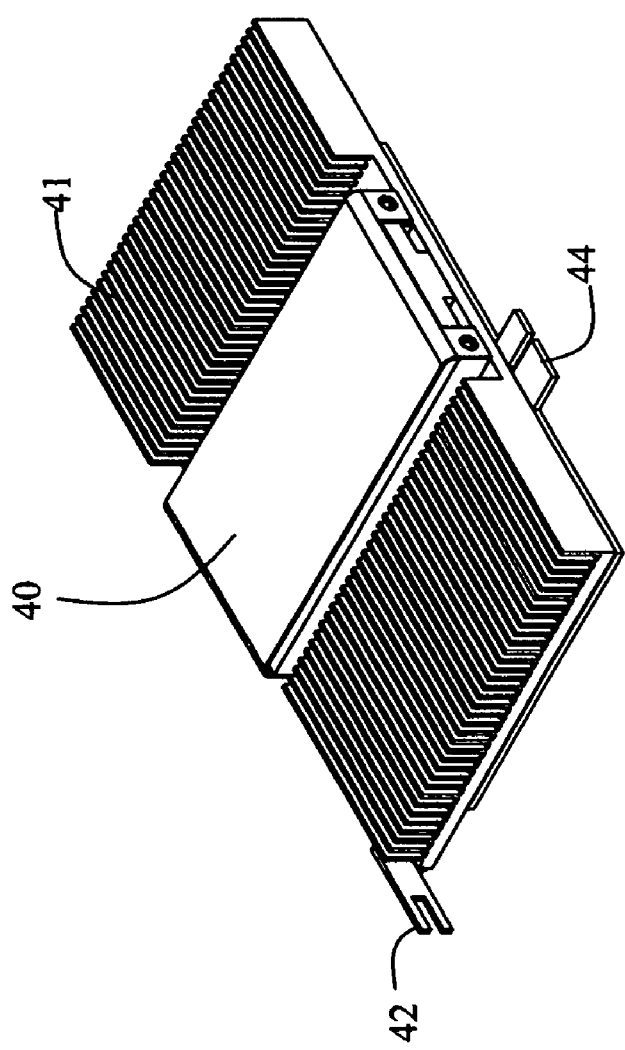
FIG. 3 a schematic diagram for an auxiliary dissipater of a series-connected-heat-pipe type heat dissipater according to an embodiment of the invention.
Figure 4:
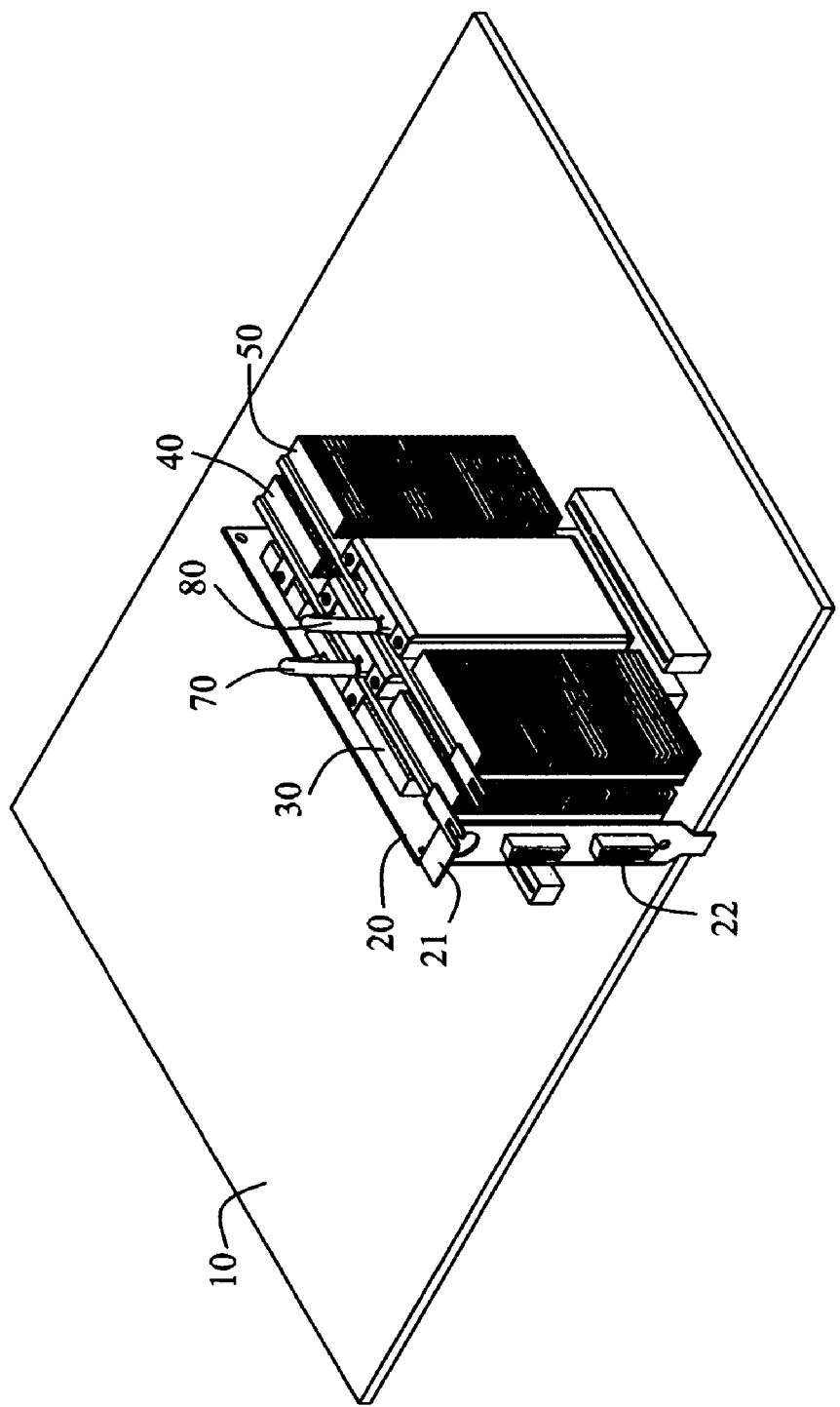
FIG. 4 is a schematic diagram of a series-connected-heat-pipe type heat dissipater installed on a main-machine-board according to another embodiment of the invention.

The auxiliary dissipater 40 is plugged onto the second insertion slot 112 of the main-machine-board 10, and it can be secured to the shell (not shown) by making use of the front end design similar to the fixing plate 42 of the bracket 21 of the interface card 20. Alternatively, it can be realized through the insertion plate 44 provided at the bottom of the auxiliary dissipater 40 and directly inserted onto the second insertion slot 112 as shown in FIG. 3. Naturally, both or either of the above-mentioned methods or any other securing means may be utilized Finally, refer to FIG. 4 for a schematic diagram of a series-connected heat pipe type heat dissipater installed on a main-machine-board according to another embodiment of the invention. As shown in FIG. 4, an additional auxiliary dissipater 50 is inserted onto a third insertion slot 113, and is connected to the auxiliary dissipater 40 through heat pipe 80. Similarly, refer to FIG. 2, the auxiliary dissipaters 40 is provided with the second installation hole 432 for insertion of the heat pipe 80 used for connection. The features of another auxiliary dissipater 50 are similar, thus they will not be repeated here for brevity. Likewise, a plurality of auxiliary dissipaters may be series-connected to increase the heat dissipation efficiency depending on the actual requirements of the interface card.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat dissipater, applied on an interface card of a computer system, which is provided with a plurality of insertion slots for inserting said interface card, said heat dissipater comprising:

a main dissipater, placed on a chip of said interface card for transferring the heat generated by said chip, and an auxiliary dissipater, located on an insertion slot adjacent to said interface card, wherein the auxiliary dissipater is connected to said main dissipater through a heat pipe.

2. The heat dissipater of claim 1, further comprising at least one another auxiliary dissipater connected together by a heat pipe, and disposed sequentially onto said adjacent insertion slot.

3. The heat dissipater of claim 1, wherein said main dissipater includes a plurality of heat dissipation fins.

4. The heat dissipater of claim 1, wherein said auxiliary dissipater includes a plurality of heat dissipation fins.

5. The heat dissipater of claim 1, wherein said heat pipe is secured to said main dissipater and said auxiliary dissipater through a elastic plate respectively.

6. The heat dissipater of claim 1, wherein said heat pipe is secured to said main dissipater and said auxiliary dissipater through a bolt respectively.

7. The heat dissipater of claim 1, wherein said heat pipe is secured to said main dissipater and said auxiliary dissipater through a rotation button respectively.

8. The heat dissipater of claim 1, wherein said auxiliary dissipater is inserted on said insertion slot.

9. The heat dissipater of claim 1, wherein said auxiliary dissipater is placed on said insertion slot.

* * * * *